United States Patent [19]

Eklund

[11] Patent Number: 5,407,837
[45] Date of Patent: Apr. 18, 1995

[54] METHOD OF MAKING A THIN FILM TRANSISTOR

[75] Inventor: Robert H. Eklund, Plano, Tex.

[73] Assignee: Texas Instruments Incorporated, Dallas, Tex.

[21] Appl. No.: 108,357

[22] Filed: Aug. 18, 1993

Related U.S. Application Data

[62] Division of Ser. No. 938,196, Aug. 31, 1992, abandoned.

[51] Int. Cl.6 .......................................... H01L 21/265
[52] U.S. Cl. ........................................ 437/21; 437/41; 437/200; 437/909
[58] Field of Search ................. 437/21, 41, 200, 909

[56] References Cited

U.S. PATENT DOCUMENTS

| | | | |
|---|---|---|---|
| 4,510,670 | 4/1985 | Schwabe et al. | 29/571 |
| 4,877,755 | 10/1989 | Rodder | 437/200 |
| 4,882,297 | 11/1989 | Blossfeld | 437/200 |
| 5,075,251 | 12/1991 | Torres et al. | 437/200 |
| 5,185,280 | 2/1993 | Houston et al. | 437/44 |
| 5,252,502 | 10/1993 | Havemann | 437/41 |

FOREIGN PATENT DOCUMENTS

| | | | |
|---|---|---|---|
| 0456059 | 11/1991 | European Pat. Off. | 257/350 |
| 62-94937A | 5/1987 | Japan | 437/200 |

OTHER PUBLICATIONS

Wolf, "Silicon Processing for the VLSI ERA", vol. II; pp. 194–199, 1990.

*Primary Examiner*—Olik Chaudhuri
*Assistant Examiner*—Richard A. Booth
*Attorney, Agent, or Firm*—Ruben C. DeLeon; James C. Kesterson; Richard L. Donaldson

[57] ABSTRACT

This is a method of fabricating a transistor on a wafer. The method comprises: forming a doped silicon layer; patterning the active transistor regions of the doped silicon layer and utilizing a silicon etch to remove the non-transistor regions of the doped silicon layer to create a silicon mesa; forming a gate oxide layer on a doped silicon mesa; depositing a polysilicon layer on top of the oxide layer; depositing a photoresist layer over the polysilicon mesa; patterning the photoresist layer with a gate configuration; etching to remove portions of the polysilicon layer using the photoresist as a mask to create a polysilicon gate; depositing a TEOS layer over the polysilicon gate and exposed gate oxide; etching to remove portions of the TEOS layer and the exposed gate oxide to leave sidewall spacers on sides of the polysilicon gate and sides of silicon mesa; depositing a metal layer over remaining portions of the polysilicon gate, the sidewall spacers, and the silicon mesa; annealing the wafer to react portions of the metal layer with exposed portions of the silicon mesa to form a metal silicide; etching all unreacted the metal layer to leave the silicided portions of the polysilicon gate and silicided portion of the doped silicon layer.

15 Claims, 3 Drawing Sheets

METHOD OF MAKING A THIN FILM TRANSISTOR

This is a divisional of application Ser. No. 07/938,196, filed Aug. 31, 1992, now abandoned.

FIELD OF THE INVENTION

This invention generally relates to thin film metal-oxide-semiconductor field effect transistors.

BACKGROUND OF THE INVENTION

Without limiting the scope of the invention, its background is described in connection with creating thin film metal-oxide-semiconductor (MOS) field effect transistors, as an example.

Since the invention of the integrated circuit, work has been done to increase the number of components per unit of chip area, to improve device performance and to streamline the manufacturing process. The first integrated circuits were bipolar devices and used the junction isolation technique. However, as the demand for smaller and smaller devices increased, new technologies were developed which had higher packing density than bipolar devices. The metal-oxide-semiconductor devices have now substantially replaced bipolar devices where very high packing density is required, such as in memories and microprocessors. As the demand for faster, higher density metal-oxide-semiconductor devices continues, improvements in fabrication technology are necessary to keep pace with the demand.

Silicon-on-insulator (SOI) technology offers the highest performance for a given feature size due to the minimization of parasitic capacitance. Some of the SOI MOS field effect transistors have used a mesa configuration, others may use thick field oxide for isolation of the transistor. Various methods exist to create a mesa configuration. For further explanation on mesa configurations, see U.S. Pat. No. 5,087,580 issued to Robert Eklund on Feb. 11, 1992.

In addition, conventional SOI MOS field effect transistors use ion implanted source/drain regions. In order to ion implant the source/drain region, a photoresist layer is usually deposited and patterned over a silicon layer. Then the ions are implanted into the exposed silicon surface. The photoresist is then removed and the wafer is annealed. This results in comparable processing complexity to conventional bulk MOS field effect transistors just to make the source/drain regions.

Some of the problems faced have been related to the complexity of processing a conventional transistor. The complexity of the manufacturing process for a device, usually correlates to the price of manufacturing the device (disregarding the difference in cost of different materials).

Accordingly, improvements which overcome any or all of the problems are presently desirable.

SUMMARY OF THE INVENTION

It is herein recognized that a need exists for improvement in the fabrication of a MOS field effect transistor. The present invention is directed towards meeting those needs.

Generally, and in one form of the invention, in order to simplify the transistor structure and process, a Schottky diode could be used for the source/drains. Use of silicide such as $TiSi_2$, for example, would provide for relatively the same barrier height to N and P type silicon. The silicide would replace the source/drain regions of transistor.

An advantage of the invention is the simplification of the manufacturing process of a MOS field effect transistor. Since the source/drain regions do not have to be patterned, doped and annealed, the number of steps required to manufacture the transistor is reduced. This invention reduces the number of steps required to manufacture each transistor, and thus would reduce the total manufacturing cost of each transistor.

This is a method of fabricating a transistor on a wafer. The method comprises: forming a doped silicon layer; patterning the active transistor regions of the doped silicon layer and utilizing a silicon etch to remove the non-transistor regions of the doped silicon layer to create a silicon mesa; forming a gate oxide layer on a doped silicon mesa; depositing a polysilicon layer on top of the oxide layer; depositing a photoresist layer over the polysilicon mesa; patterning the photoresist layer with a gate configuration; etching to remove portions of the polysilicon layer using the photoresist as a mask to create a polysilicon gate; depositing a TEOS layer over the polysilicon gate and exposed gate oxide; etching to remove portions of the TEOS layer and the exposed gate oxide to leave sidewall spacers on sides of the polysilicon gate and sides of silicon mesa; depositing a metal layer over remaining portions of the polysilicon gate, the sidewall spacers, and the silicon mesa; annealing the wafer to react portions of the metal layer with exposed portions of the silicon mesa to form a metal silicide; etching all unreacted the metal layer to leave the silicided portions of the polysilicon gate and silicided portion of the doped silicon layer.

Preferably, the forming of the doped silicon layer is by ion-implantation, and the metal is titanium and corresponding silicide is titanium silicide.

In one alternate embodiment, the metal is cobalt and the silicide is cobalt silicide.

In another alternate embodiment, the metal is nickel and the silicide is nickel silicide.

In still, another alternate embodiment, the silicon layer may be polycrystalline and annealed to provide enlarged crystals of silicon.

Alternately, the silicon may be formed on an insulator such as a thick field oxide or a SIMOX wafer.

DETAILED DESCRIPTION OF PREFERRED EMBODIMENTS

The term metal-oxide-semiconductor (MOS) is defined for purposes of this disclosure as including structures in which an insulator (or combination of insulators) is sandwiched between a conductor and a semiconductor. This definition will be understood to include structures where polycrystalline silicon is the conductor and structures where the semiconductor is either single crystal or polycrystalline silicon.

FIGS. 1-8 depict-successive stages of the manufacture of a MOS field effect transistor shown in cross-section.

Figure 1:
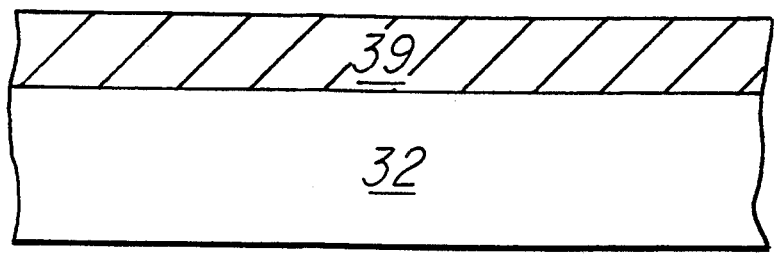
FIGS. 1-7 are elevation views in section of a part of a semiconductor integrated circuit chip at successive stages.

(a) In FIG. 1, the transistor is formed in the silicon layer 39 on an SOI substrate (such as a SIMOX substrate, or a bond-and-etchback wafer, for example). The silicon layer 39 is also doped in accordance to the type of transistor desired (NMOS or PMOS). Typically, this doping is done by ion implantation.

Figure 2:
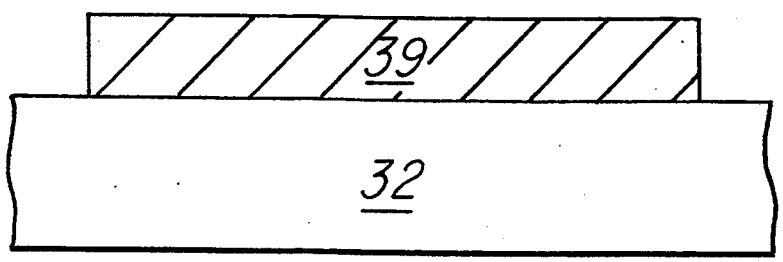

(b) In FIG. 2, the active transistor region is patterned, and the doped silicon layer 39 is etched with a silicon etch to remove the non-transistor regions. The resultant silicon mesa is shown in FIG. 2.

Figure 3:
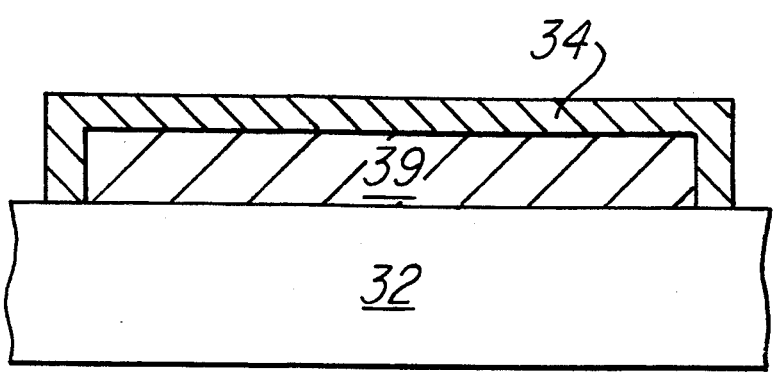

(c) In FIG. 3, a gate oxide 34 is then deposited or grown on top of the doped silicon mesa 39. (This gate oxide 34 may be, for example, 200Å in thickness and grown by the thermal oxidation.)

Figure 4:
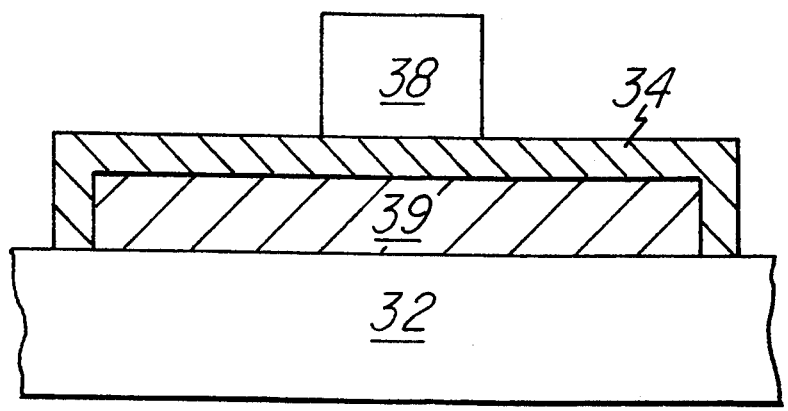

(d) In FIG. 4, a polysilicon layer (not shown) is deposited on top of the gate oxide 34 to form the gate electrode. An appropriate dopant can then be implanted in the polysilicon gate 38 (this doping could be done during the original deposition by in-situ doping). The polysilicon layer would then be patterned and etched to form the polysilicon gate 38.

Figure 5:
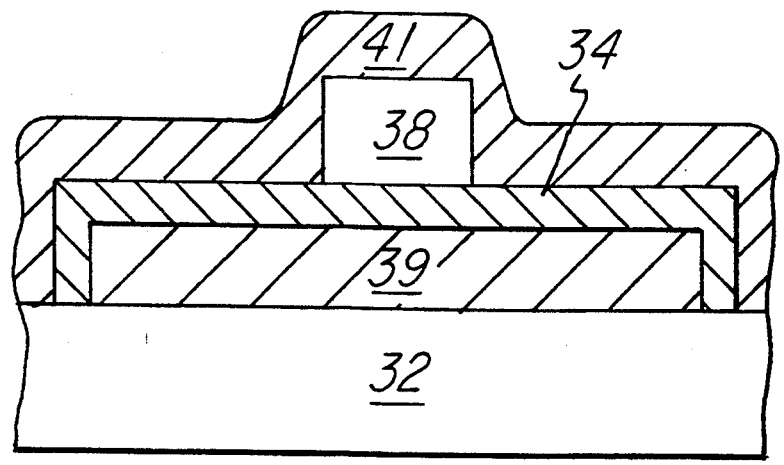

(e) In FIG. 5, a TEOS layer 41 is deposited over the polysilicon gate 38, and the exposed gate oxide 34.

Figure 6:
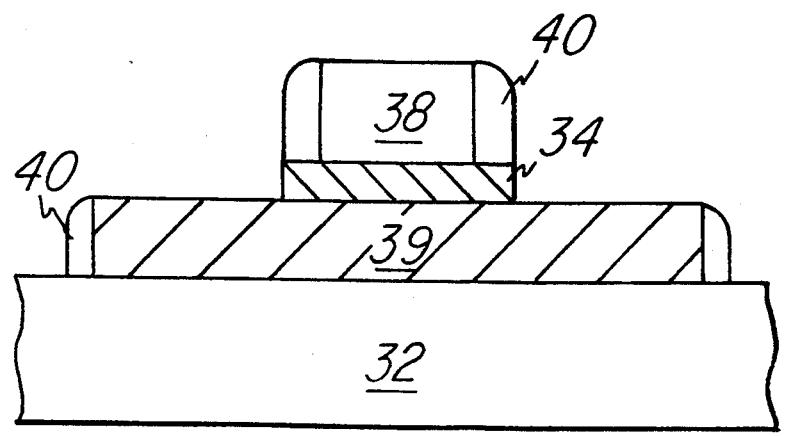

(f) In FIG. 6, the sidewall spacers 40 are formed by using an anisotropic etch. The TEOS is etched into the sidewall spacers 40. The gate oxide 34 is etched as well by an anisotropic etch.

Figure 7:
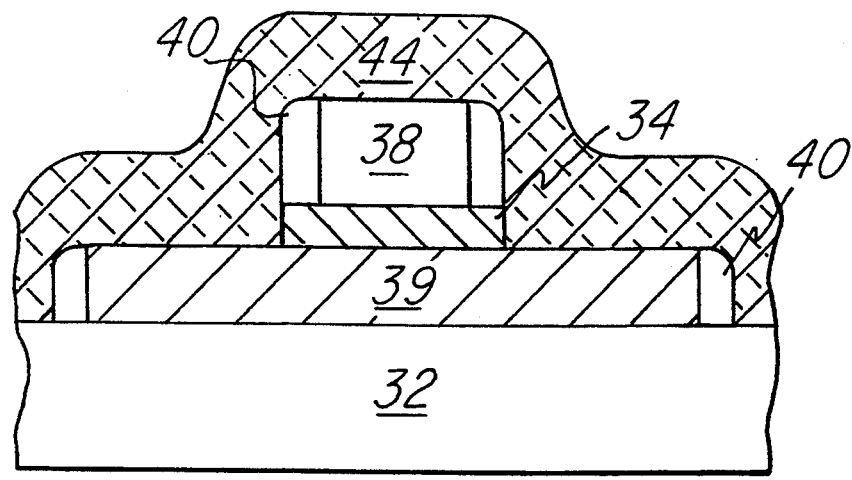

(g) In FIG. 7, a layer of metal 44 is deposited over the polysilicon gate 38, the sidewall spacers 40, and the exposed insulator 32 (the metal could, for example, be titanium or cobalt.)

Figure 8:
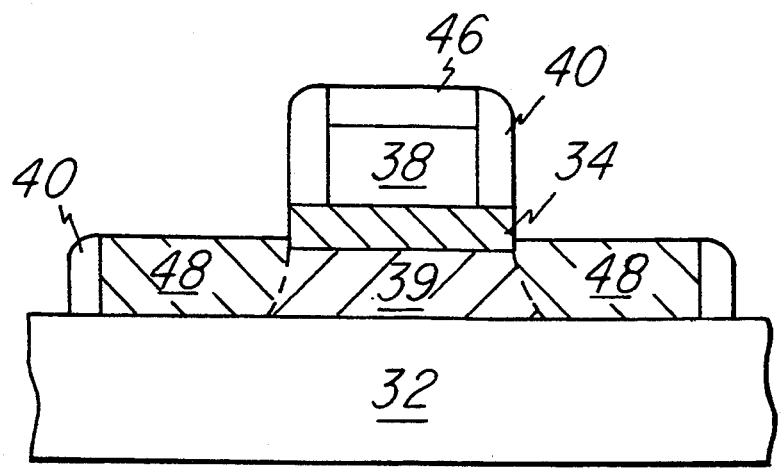
FIG. 8 is an elevation view in section of a part of a semiconductor integrated chip showing an MOS field effect transistor made according to the invention thereof.

(h) In FIG. 8, annealing forms a gate silicide 46 where the silicon layer 39 and polysilicon gate 38 is exposed to the metal. The silicided regions formed in the polysilicon layer provide the source/drain regions 48. The unreacted metal is then removed to leave the structure in FIG. 8.

A few preferred embodiments have been described in detail hereinabove. It is to be understood that the scope of the invention also comprehends embodiments different from those described, yet within the scope of the claims. Various modifications and combinations of the illustrative embodiments, as well as other embodiments of the invention, will be apparent to persons skilled in the art upon reference to the description (for example, the semiconductor layer 39 can be doped during deposition). It is therefore intended that the appended claims encompass any such modifications or embodiments.

What is claimed is:

1. A method of fabricating a MOS field effect transistor on a wafer comprising:
   a. forming a gate oxide layer on a doped silicon layer;
   b. utilizing a photoresist layer to pattern a doped polysilicon layer to form a gate whereby some of said gate oxide layer is exposed;
   c. isotropically depositing a conformal oxide layer over said polysilicon gate and exposed gate oxide;
   d. anisotropically etching to remove portions of said conformal oxide layer and said exposed gate oxide to leave sidewall spacers on sides of said polysilicon gate;
   e. depositing a metal layer over remaining portions of said polysilicon gate, said sidewall spacers, and said silicon layer;
   f. annealing said wafer to react portions of said metal layer with exposed portions of said silicon layer to form a metal silicide; and
   g. etching all unreacted portions of said metal layer to leave the silicided portions of said polysilicon gate and silicided portions of said doped silicon layer, wherein silicided regions are over said polysilicon gate and provide source/drain regions within said silicon layer, and said silicided source/drain regions are in direct contact with said channel region.

2. The method of claim 1, wherein forming of said doped silicon layer is by ion implantation.

3. The method of claim 1, wherein said metal is titanium and said silicide is titanium silicide.

4. The method of claim 1, wherein said metal is cobalt and said silicide is cobalt silicide.

5. The method of claim 1, wherein said metal is nickel and said silicide is nickel silicide.

6. The method of claim 1, wherein said metal is a refractory metal and the silicide is the corresponding silicide compound.

7. The method of claim 1, wherein said silicon layer is polycrystalline.

8. The method of claim 7, wherein said polycrystalline silicon layer is annealed prior to silicide formation to provide enlarged crystals of silicon.

9. The method of claim 1, wherein said silicon layer is formed on an insulator.

10. The method of claim 9, wherein said insulator is a field oxide or nitride of thickness greater than 1000Å.

11. The method of claim 9, wherein a silicon mesa is formed out of said silicon layer.

12. The method of claim 1, wherein said silicon layer is formed on a silicon substrate.

13. A method of fabricating a MOS field effect transistor on a wafer comprising:
   a. forming a gate oxide layer on said doped silicon layer;
   b. depositing a polysilicon layer on top of said gate oxide layer;
   c. depositing a photoresist layer over said polysilicon layer;
   d. patterning said photoresist layer with a gate configuration;
   e. etching to remove portions of said polysilicon layer using said photoresist as a mask to create a polysilicon gate prior to silicide formation;
   f. depositing a TEOS layer over said polysilicon gate and exposed gate oxide;
   g. etching to remove portions of said TEOS layer and said exposed gate oxide to leave sidewall spacers on sides of said polysilicon gate;
   h. depositing a metal layer over remaining portions of said polysilicon gate, said sidewall spacers, and said silicon layer;
   i. annealing said wafer to react portions of said metal layer with exposed portions of said silicon layer to form a metal silicide; and
   j. etching all unreacted said metal layer to leave the silicided portions of said polysilicon gate and silicided portion of said doped silicon layer, wherein said silicided source/drain regions provide the source/drain regions of the transistor.

14. The method of claim 1, wherein said silicon layer is single crystalline.

15. The method of claim 13, wherein said silicon layer is single crystalline.

* * * * *